United States Patent [19]
Leonard et al.

[11] Patent Number: 5,506,171
[45] Date of Patent: Apr. 9, 1996

[54] METHOD OF CLEAN UP OF A PATTERNED METAL LAYER

[75] Inventors: Jerry L. Leonard, Plano; Brynne K. Bohannon, Sachse, both of Tex.

[73] Assignee: Texas Instruments Incorporated, Dallas, Tex.

[21] Appl. No.: 485,201

[22] Filed: Jun. 7, 1995

Related U.S. Application Data

[62] Division of Ser. No. 342,674, Nov. 21, 1994, which is a continuation of Ser. No. 991,229, Dec. 16, 1992, abandoned.

[51] Int. Cl.$^6$ ............................................. H01L 21/306
[52] U.S. Cl. .................. 437/187; 156/646.1; 156/656.1; 437/245
[58] Field of Search ................................. 437/245, 187; 156/656.1, 646.1

[56] References Cited

U.S. PATENT DOCUMENTS

| | | | |
|---|---|---|---|
| 4,445,966 | 5/1984 | Carlson | 156/656.1 |
| 4,595,433 | 6/1986 | Yamazaki | 156/646.1 |
| 4,690,728 | 9/1987 | Tgang | 156/646.1 |
| 4,749,440 | 6/1988 | Blackwood | 156/646.1 |
| 4,857,481 | 8/1989 | Tam | 437/182 |
| 4,897,154 | 1/1990 | Chakravarti | 156/646.1 |
| 4,923,828 | 5/1990 | Gluck | 156/646.1 |
| 5,167,761 | 12/1992 | Westendorp | 156/646.1 |
| 5,352,327 | 10/1994 | Witowski | 156/646.1 |

*Primary Examiner*—George Fourson
*Assistant Examiner*—Scott Kirkpatrick
*Attorney, Agent, or Firm*—Julie L. Reed; James C. Kesterson; Richard L. Donaldson

[57] ABSTRACT

A method of fabricating deformable mirror devices, or any other device, in which a metal pattern is to be etched over a photoresist layer. The method includes removal of a contaminating layer (11) that occurs as a result of the metal etch. This removal is accomplished at the wafer level, with an anhydrous hydrofluoric etch followed by a wet rinse.

9 Claims, 2 Drawing Sheets

METHOD OF CLEAN UP OF A PATTERNED METAL LAYER

This is a division of application Ser. No. 08/342,674, filed Nov. 21, 1994 which is a continuation of application Ser. No. 07/991,229, filed Dec. 16, 1992 now abandoned.

TECHNICAL FIELD OF THE INVENTION

This invention relates to fabrication of integrated circuits, and more particularly to an improved method of fabricating a patterned metal layer over a spacer layer, and subsequently etching away the spacer layer.

BACKGROUND OF THE INVENTION

DMDs are a type of spatial light modulator, characterized by array of micro-mechanical pixel elements having reflective surfaces. The pixel elements are electronically addressable, such that each can be selectively positioned to direct light in either an "on" or "off" position. An addressed array of pixel elements represents an image frame, with the image being formed as a result of which pixel elements direct light to an image plane. The image can be captured by means of opto-electrical devices and used to generate a display or printed copy.

Typically, the pixel elements of a DMD have associated memory cells for storing the binary signal that will drive the pixel element to its on or off position. An advantage of many DMD designs is that the pixel array, as well as the memory cells and addressing circuits can be fabricated with integrated circuit techniques.

In general, DMD pixel architectures may be distinguished by type of deformation modes, namely torsion beam or cantilever beam. Torsion beam pixels consist of a thick reflective beam suspended over an air gap and connected between two supports by two thin torsion hinges that are under tension. When an address electrode, underlying one half of the torsion beam, is energized, the torsion hinges are twisted and the beam rotates about the axis of the hinges. Cantilever beam pixels consist of a thick reflective beam suspended over an air gap, connected by a thin cantilever hinge to a support. When an underlying address electrode is energized, the cantilever hinge bends and the beam tip is deflected toward the address electrode.

Fabrication of both torsion beam and cantilever beam pixels is typically on top of an address circuit already fabricated on a semiconductor wafer. Once the address circuit is formed, a planarizing spacer layer is placed on the wafer. This spacer layer provides a smooth surface on which to form the hinges and beams. A metal layer is then patterned in the desired shape of the hinges and beams. Finally, the spacer layer is removed from under the beams by an isotropic plasma etch to form the air gap between the beams and address electrodes.

In many fabrication processes, it is desirable to perform the metal patterning at the wafer level. Then, a protective coating is placed over the entire wafer, the wafer is sawed into chips, and the protective coating is removed. Then, the plasma etch is performed to remove the spacer, such that undercutting of the metal pattern occurs to form air gaps. Thus, the spacer removal is at the chip level.

A problem with existing fabrication processes is that the patterning of the metal layer results in a contaminating layer on top of the spacer. This contaminating layer is a mixture of materials that is not easily etched.

FIG. 1 illustrates a chip 10 having this contaminating layer 11 over the spacer layer 12. Chip 10 is one of many chips whose various layers have been fabricated in wafer form, with the wafer then being sawed into the chips. Before sawing, a protective coating 18 was deposited over the entire wafer. FIG. 1 also shows the address circuitry 13, mirror beam 14, hinge 15, support post 16 formed in prior fabrication steps, as well as an oxide layer 17 used for metal patterning, which has not yet been removed. When the time comes for removal of the spacer layer 12, the contaminating layer 11 interferes with this removal. Incomplete removal results in "webbing" between the mirror beams 14 and limits their performance.

Previous efforts to remove the contaminating layer 11 have been performed "as needed". Thus, because spacer layer 12 is not removed until after the wafer is cut into chips, removal of the contaminating layer 11 is also performed at the chip level. However, this is unnecessarily time consuming. A need exists for a fabrication method that avoids the need for a chip level cleanup of contaminants left by metal patterning.

SUMMARY OF THE INVENTION

One aspect of the invention is a method for patterning metal from a metal layer deposited over a photoresist layer of a semiconductor wafer. The relevant steps begin with depositing a metal layer over a photoresist layer on the semiconductor wafer. Portions of the metal layer are etched away to form a desired metal pattern. Byproducts of the metal etching step are removed with an anhydrous hydrofluoric vapor etch of the surface of said wafer. This vapor etch is performed in an etching chamber and is the result of a reaction of water vapor and hydrofluoric acid gas. The vapor etch is followed by a rinse of the surface of the wafer with water.

A technical advantage of the invention is that the contaminants resulting from metal etching are removed in one step at the wafer level, rather than on a chip-by-chip basis. No pre-undercut clean-up is needed at the chip level. Complete undercutting of a spacer layer under a metal pattern may be accomplished without affecting the metal pattern.

When the method of the invention is used to make specific devices, such as DMDs, the manufacturing process is shortened and the operation of the devices themselves is improved.

DETAILED DESCRIPTION OF THE INVENTION

FIGS. 2A–2F illustrate a process of fabricating a metal pattern on a wafer 20, which eliminates contaminating layer 11 at the wafer level. Wafer 20 will eventually be cut into chips to make DMDs. Only a cross sectional view of a single pixel element is shown. An actual wafer 20 would have thousands of such pixel elements.

The various layer-by-layer process steps relevant to patterning a metal layer 21 over a spacer layer 12 are shown. DMDs are an example of an integrated circuit device fabricated by patterning a metal pattern over a spacer layer, with the latter being subsequently removed to form air gaps under the metal elements.

The method of the invention would be useful for any other type of product, made in wafer form with integrated circuit fabrication techniques, in which a metal layer is to be patterned. However, the invention is especially useful for products, such as DMDs, where the contaminating layer 11 interferes with subsequent process steps. In the case of DMDs, contaminating layer 11 interferes with undercutting of a spacer layer 11 under a metal pattern.

Figure 2A:
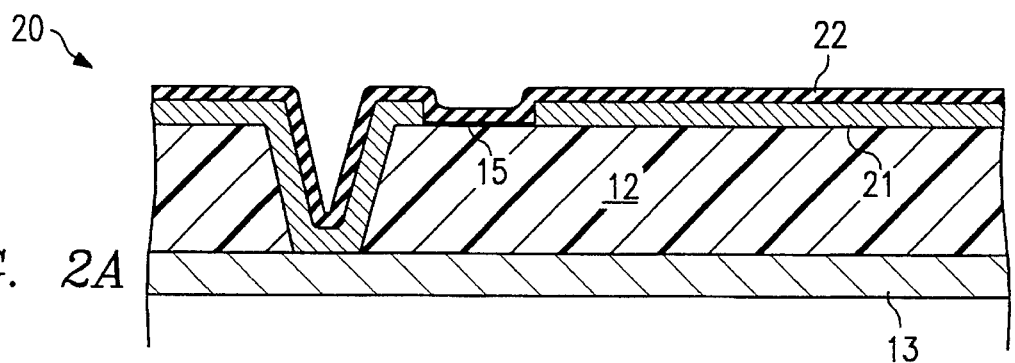
FIGS. 2A–2F illustrate a process of fabricating a metal pattern on a wafer that eliminates the contaminating layer of FIG. 1 at the wafer level.

In FIG. 2A, a spacer layer 12 has been placed over the address circuit 13 of the wafer 20. In the example of this description, spacer layer 12 is made from photoresist material, but could be any etchable substance. Spacer layer 12 has been etched to create vias, over which a metal layer 21 is conformally deposited everywhere. Then, an oxide layer 22 is conformally deposited everywhere over metal layer 21. As explained below, metal layer 21 will become beam 14 and support post 16. Oxide layer 17 is for etching purposes and will eventually be removed. It is assumed that previous patterning steps have already formed hinge 15.

The DMD illustrated in FIG. 2A is a cantilever beam DMD with a support post 16. The process described herein could be applied to other types of DMDs, such as those that only partially undercut spacer layer 12 to leave portions of spacer layer 12 as support posts.

Figure 2B:
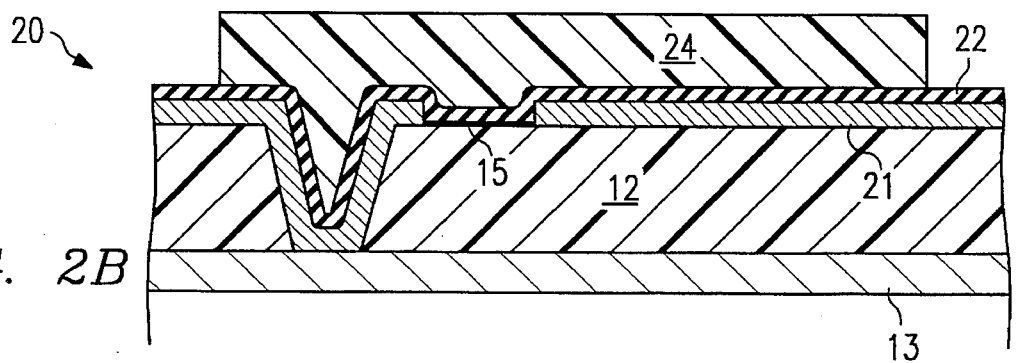

In FIG. 2B, a photoresist layer has been deposited and patterned over oxide layer 22 to form a photoresist mask 24. This mask 24 will protect oxide layer 22 from being etched away during the next step, which is an etching step. Mask 24 corresponds to areas in which it is desired for metal layer 21 to remain after etching, resulting in beams 14. Photoresist mask 24 is formed by using conventional photoresist patterning and exposure techniques.

Figure 2C:
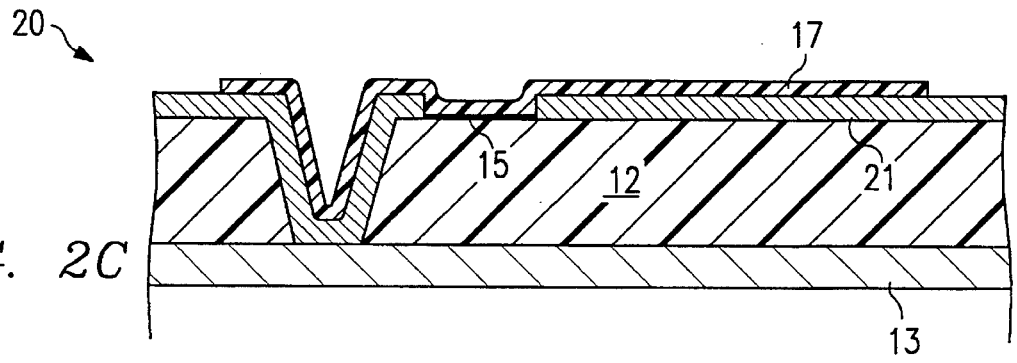

FIG. 2C illustrates a beam oxide mask 17, which corresponds to areas in which beams 14 will be formed. The beam oxide mask 17 is what remains after those areas of oxide layer 22 not protected by photoresist mask 24 have been etched away. After this oxide etch, photoresist mask 24 is removed using conventional techniques.

Figure 2D:
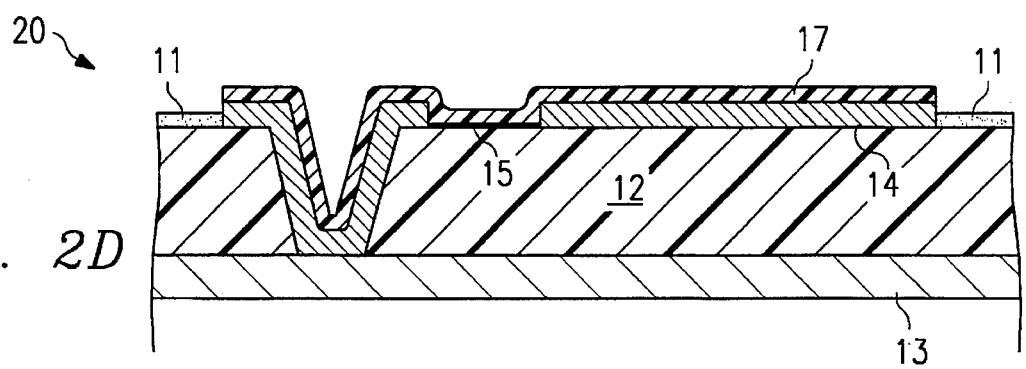

FIG. 2D illustrates wafer 20 after etching of metal layer 21 to form beam 14. Oxide mask 17 protects those areas of metal layer 21 that are not to be etched away. The etch is a plasma etch, and removes unprotected portions of metal layer 21 down to the surface of spacer layer 12. As a result of the metal etch, a contaminating layer 11 remains on the surface of photoresist layer 12.

Figure 2E:
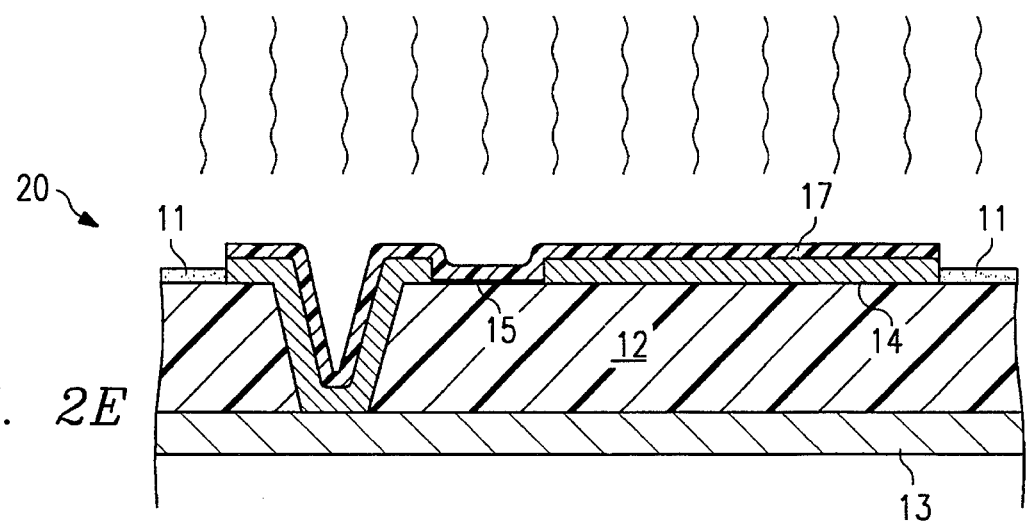

FIG. 2E illustrates the removal of contaminating layer 11 by means of a hydrofluoric (HF) acid vapor cleanup in accordance with the invention. Essentially, the clean-up process combines a dry anhydrous HF etch with a wet rinse. In a two-phase clean-up process, contaminating layer 11 is removed by the HF etching, which results in water soluble by-products that are removed during the wet rinse.

The process for removing contaminating layer 11 is performed while wafer 20 is placed in a chamber. The basic steps of the clean-up process are:

0) Introducing a high purge nitrogen into the chamber to remove atmospheric gases and to reduce the background water levels.

1) Reducing the nitrogen flow to a selected flow rate, such that it serves as a carrier gas for the reactants. The pressure may be stabilized at a slight positive pressure to promote uniform gas distribution.

2) Adding water-laden nitrogen at a predetermined flow rate to allow a thin layer of water to condense on the surface of wafer 20. This is essentially a water vapor "pretreatment".

3) Adding anhydrous HF at a predetermined flow rate. The nitrogen flow rates for the carrier gas and the water vapor are also adjusted to a predetermined level. This results in etching of the surface of wafer 20, using nitrogen, water vapor, and HF gas constituents. The result is an HF vapor, which etches the surface of wafer 20. The etch is continued for a predetermined period of time. During this etch, contaminating layer 11 is removed.

4) Rinsing with a high flow nitrogen purge to remove the etch reactants.

5) Rinsing with deionized rinse water to remove etch byproducts.

6) Discontinue water rinse and allowing water on wafer 20 to be removed before ramping up to dry spin speed.

7) Spin drying the wafer with nitrogen to prevent oxide regrowth.

The temperature and pressure conditions for the above steps are ambient, except as noted.

The above clean-up processing may be performed with commercially available vapor phase etching equipment. An example of such equipment is the Excalibur equipment, manufactured by FSI International. That equipment and its operation are described in U.S. Pat. No. 4,749,440, entitled "Gaseous Process and Apparatus for Removing Films from Substrates", incorporated by reference herein. In a vapor phase etcher, wafers are etched in a sealed etch chamber and then transported to a rinse chamber. A specific example of a vapor clean/wet rinse "recipe", which could be used with the Excalibur equipment is set out in the table below. The step numbers of the table correspond to the numbers of the steps discussed above. Reactants are measured in liters per minute (lpm) and cubic centimeters per minute (ccm). The wafer 20 is rotated on a platform within the chamber at speeds measured in revolutions per minute (rpm).

| Step # | Time (Sec) | $N_2A$ (l pm) | Vapor (l pm) | HF (sccm) | $N_2B$ (l pm) | $H_2O$ (0/1) | V (rpm) |
| --- | --- | --- | --- | --- | --- | --- | --- |
| 0 | 5 | 30.0 | | | 1.0 | 0 | 20 |
| 1 | 5 | 12.0 | | | 1.0 | 0 | 20 |
| 2 | 10 | 12.0 | 2.0 | | 1.0 | 0 | 20 |
| 3 | 10 | 16.0 | 10.0 | 180 | 1.0 | 0 | 20 |
| 4 | 15 | 22.0 | 2.0 | | 1.0 | 0 | 20 |
| 5 | 10 | 6.0 | | | 1.0 | 1 | 1000 |
| 6 | 1 | 6.0 | | | 1.0 | 0 | 1000 |
| 7 | 15 | 30.0 | | | 1.0 | 0 | 3000 |

In the above table, the entries under $N_2A$ are the primary nitrogen flow. The entries under $N_2B$ are a low range "backside" flow, specific to the type of vapor phase equipment.

An advantage of the vapor clean-up is that it is selective, i.e., it removes only contaminating layer 11 without attacking beam 14 or spacer layer 12. Spacer layer 12 remains intact during the sawing phases until it is desired to be removed at the chip level.

Figure 1:
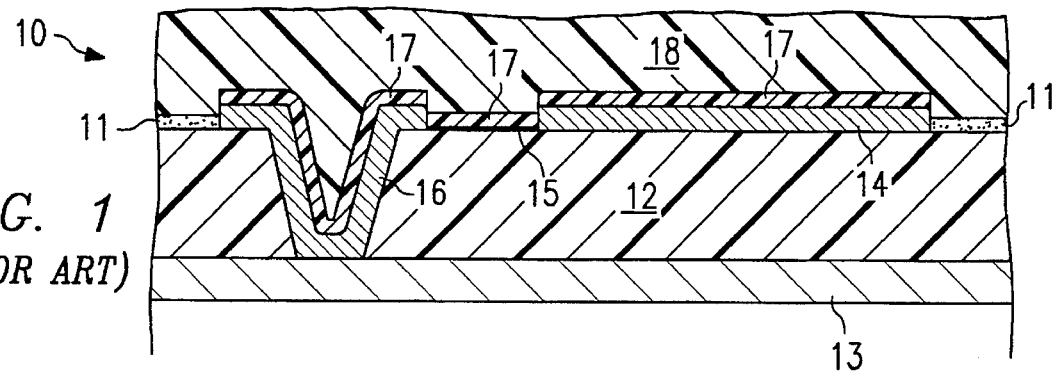
FIG. 1 illustrates a semiconductor chip having a contaminating layer over a spacer layer, resulting from an etch of a metal layer.
Figure 2F:
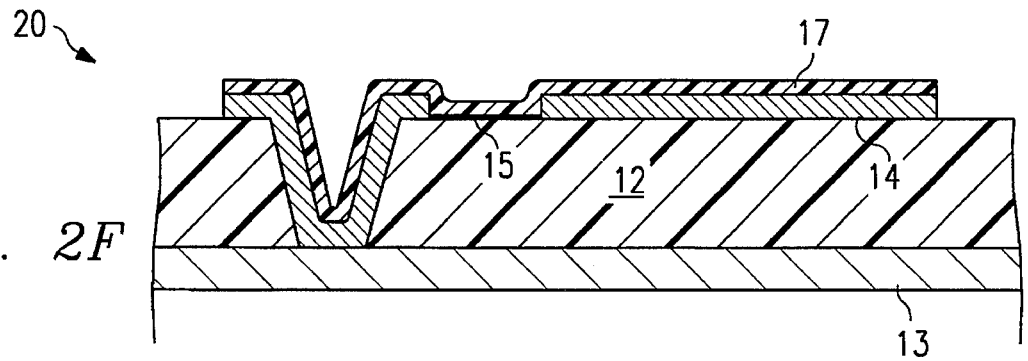

FIG. 2F illustrates wafer 20, after contaminating layer 11 has been removed. The next steps will be application of a protective coating and sawing into chips. As compared to FIG. 1, as a result of the process described herein, contaminating layer 11 of prior art methods will not be present at the chip level.

An experimental test has indicated that, for a particular wafer sample, contaminating layer 11 includes an oxygen concentration of 12.9% in the form of silicon dioxide, organic material, a fluoro-polymer ($H_4C_5O_3F_6$), and aluminum oxide. The concentrations of aluminum oxide and silicon dioxide were 6.1% and 1.6%, respectively. This analysis of the nature of the contaminants in layer 11 suggests the specific cause of the "webbing" during removal of spacer layer 12. After the vapor clean-up, the concentration of these oxygen-bearing elements was reduced to 8.1%. Concentrations of silicon dioxide and aluminum oxide were reduced to nominal amounts.

OTHER EMBODIMENTS

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for patterning metal from a metal layer deposited over a photoresist layer of a semiconductor wafer, comprising the steps of:

depositing a metal layer over a photoresist layer on the semiconductor wafer;

etching away portions of said metal layer to form a metal pattern;

removing byproducts of said etching step with an anhydrous hydrofluoric vapor etch of the resulting structure; and rinsing the resulting structure with a liquid.

2. The method of claim 1, wherein said etching step is performed by depositing an oxide layer over said metal layer, depositing a photoresist layer over said oxide layer, patterning said photoresist layer to form a photoresist pattern corresponding to said metal pattern, removing portions of said oxide layer not covered by said photoresist pattern to form an oxide pattern corresponding to said metal pattern, and etching away portions of said metal layer not covered by said oxide pattern.

3. The method of claim 1, wherein said step of removing byproducts is performed by using water vapor and anhydrous hydrofluoric acid gas.

4. The method of claim 3, wherein said water vapor and anhydrous hydrofluoric acid gas are carried by a nitrogen carrier.

5. The method of claim 1, wherein said step of removing byproducts is immediately preceded by a water vapor pretreatment.

6. The method of claim 1, wherein said step of removing byproducts is immediately preceded by a purge of nitrogen.

7. The method of claim 1, wherein said step of removing byproducts is immediately followed with a purge of nitrogen.

8. The method of claim 1, wherein said rinsing step is performed with water.

9. The method of claim 1, further comprising a spin dry step after said rinsing step.

\* \* \* \* \*